(12) United States Patent
Oh

(10) Patent No.: US 7,095,669 B2
(45) Date of Patent: Aug. 22, 2006

(54) REFRESH FOR DYNAMIC CELLS WITH WEAK RETENTION

(75) Inventor: Jong-Hoon Oh, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/704,091

(22) Filed: Nov. 7, 2003

(65) Prior Publication Data

US 2005/0099868 A1 May 12, 2005

(51) Int. Cl.
*G11C 7/00* (2006.01)

(52) U.S. Cl. .................. 365/222; 365/201; 365/225.7; 365/233; 365/189.12

(58) Field of Classification Search ............... 365/222, 365/233, 201, 225.7, 200, 189.12
See application file for complete search history.

(56) References Cited

U.S. PATENT DOCUMENTS 5,148,546 A  9/1992  Blodgett ................ 713/320
5,329,490 A  7/1994  Murotani ................ 365/222
5,629,898 A * 5/1997  Idei et al. ................ 365/222
5,654,913 A * 8/1997  Fukushima et al. ......... 365/149

FOREIGN PATENT DOCUMENTS

EP  0 790 620 A  8/1997
WO  WO96/28825  9/1996

OTHER PUBLICATIONS

PCT International Search Report dated Feb. 14, 2005.
PCT Written Opinion dated Feb. 14, 2005.

* cited by examiner

*Primary Examiner*—Andrew Q. Tran
(74) *Attorney, Agent, or Firm*—Patterson & Sheridan, L.L.P.

(57) ABSTRACT

Methods and circuit configurations for utilizing memory cells having weak retention times are provided. For some embodiments, rows identified as having weak retention cells may be refreshed more often than "normal retention" cells. As an example, if a normal refresh period is $T_{REF}$, weak retention cells may be refreshed every $T_{REF}/2$ or $T_{REF}/4$ (possibly depending on the actual measured retention time).

26 Claims, 14 Drawing Sheets

REFRESH FOR DYNAMIC CELLS WITH WEAK RETENTION

BACKGROUND OF THE INVENTION

1. Field of the Invention

The present invention generally relates to semiconductor memory devices and, more particularly, to volatile semiconductor memory devices.

2. Description of the Related Art

The evolution of sub-micron CMOS technology has resulted in an increasing demand for high-speed semiconductor memory devices, such as dynamic random access memory (DRAM) devices, pseudo static random access memory (PSRAM) devices, and the like. Herein, such memory devices are collectively referred to as DRAM devices. Such devices utilize memory cells consisting of one transistor and one capacitor. Due to leakage, the memory cells require periodic refreshing to protect data that is stored in the memory cell from corruption or decaying over time. The data stored in the memory cell is automatically restored to a full logic level when accessed (e.g., via a read or write operation), but must be periodically refreshed when not accessed. Therefore, DRAM devices typically include refresh circuitry to facilitate memory cell refresh.

The amount of time for which a memory cell can retain data without requiring refresh is commonly referred to as the retention time of the cell. Variables in the manufacturing process may result in a broad distribution of retention times for cells within a DRAM device. Testing procedures designed to determine the retention times of cells are often performed as part of the manufacturing process. During these procedures, cells with retention times that fall below a minimum specified retention time (i.e., "weak retention cells") are identified. In some cases, a manufacturer may offer devices with differing grades, based on different maximum retention time of the cells. For example, cells of a normal grade part may have a lower retention time than a more advanced part. The more advanced grade part may be more desirable, as it requires less frequent refresh operations and, therefore, may consume less standby power. However, cells that have fallen below even the less stringent minimum retention time for normal parts may be considered as having failed.

In some devices, redundancy may be used to replace such failed cells. FIG. 1 illustrates one example of a redundancy scheme utilizing redundant circuitry to replace normal rows 102 having failed cells with redundant rows 104. The replacement may be accomplished by programming programmable read only memory (PROM) registers 106 with the row address of a row with a failed cell, such as row $102_F$ (illustratively having a row address XA). Normal rows with no failed cells are accessed normally, via normal row decoders 111. However, when the normal row XA is accessed (e.g., during a refresh, read, or write operation), the redundant circuitry detects a match with a PROM register 106 and activates a corresponding redundant row 104, via a redundant row decoder 112, instead.

One disadvantage to this redundancy scheme, however, is that the circuitry required to support redundancy (e.g., the redundant rows themselves, the PROM registers, redundant row decoder, and comparison circuitry) occupies a significant amount of chip area, which increases with the number of redundant rows. As a result, only a limited number of redundant rows are typically provided. The advent of portable devices (e.g., cell phones, personal digital assistants, and the like) has brought demands for memory with longer retention times that consume less standby power in order to increase battery life. As a result, the number of weak retention cells may increase beyond the limits of redundancy.

Accordingly, there is a need in the art for improved methods and circuit configurations for utilizing memory cells having weak retention times.

SUMMARY OF THE INVENTION

Embodiments of the present invention generally provide improved methods and circuit configurations for utilizing memory cells having weak retention times.

One embodiment provides a method for utilizing memory cells in a semiconductor memory device having a weak retention time. The method generally includes refreshing a first set of one or more rows of memory cells at a first frequency and refreshing a second set of one or more rows of memory cells at a second frequency greater than the first frequency. For some embodiments, the first one or more rows may have been identified as having one or more cells with retention times below a first minimum value.

Another embodiment provides a method of manufacturing a semiconductor memory device. The method generally includes testing rows of memory cells of the device to identify a first set of one or more rows having one or more memory cells with a retention time below a first minimum retention time, storing an indication of the first set of rows on the device, and providing refresh circuitry on the device configured to refresh the first set of rows more frequently than other rows having only memory cells with retention times at or above the first minimum retention time.

Another embodiment provides a semiconductor memory device generally including a plurality of rows of memory cells, a plurality of non-volatile memory elements to indicate a first set of one or more of the rows having one or more memory cells with retention times below a first minimum retention, and refresh circuitry. The refresh circuitry is generally configured to perform refresh operations for the first set of rows more frequently than for other rows having only memory cells with retention times at or above the first minimum time.

Another embodiment provides a semiconductor memory device generally including N rows of memory cells, wherein N is an integer, a plurality of non-volatile memory elements to indicate a first set of one or more of the N rows having one or more memory cells with retention times below a first minimum retention, a refresh address bus, a refresh address counter to generate a row address, and refresh circuitry. The refresh circuitry is generally configured to i) generate regular refresh signals to sequentially refresh the N rows while driving the row address generated by the refresh address counter on the refresh address bus and ii) generate fast refresh signals between successive regular refresh signals to additionally refresh the first set of rows while driving row addresses of the first set of rows on the refresh address bus.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention generally provide methods and circuit configurations for utilizing memory cells having weak retention times. For some embodiments, rows identified as having weak retention cells may be refreshed more often than "normal retention" cells. As an example, if a normal refresh period is $T_{REF}$, weak retention cells may be refreshed every $T_{REF}/2$ or $T_{REF}/4$ (possibly depending on the actual measured retention time). As a result, weak retention cells may work properly at this increased refresh frequency, without being replaced by redundancy. While some cells may still fail (e.g., regardless of retention time), embodiments of the present invention may reduce chip area overhead by reducing the number of redundant circuits conventionally required to replace rows with weak retention cells.

The techniques and circuits described herein for refreshing weak retention cells may be used to advantage in any type of devices that utilize dynamic memory cells that require refresh (e.g., processors, digital signal processors, or other type devices with embedded DRAM). However, to facilitate understanding, the following description will refer to memory devices, such as dynamic random access memory (DRAM) or pseudo static RAM (PSRAM) devices, as specific, but not limiting, examples of devices in which the techniques and circuits may be utilized.

An Exemplary Memory Device

Figure 1:
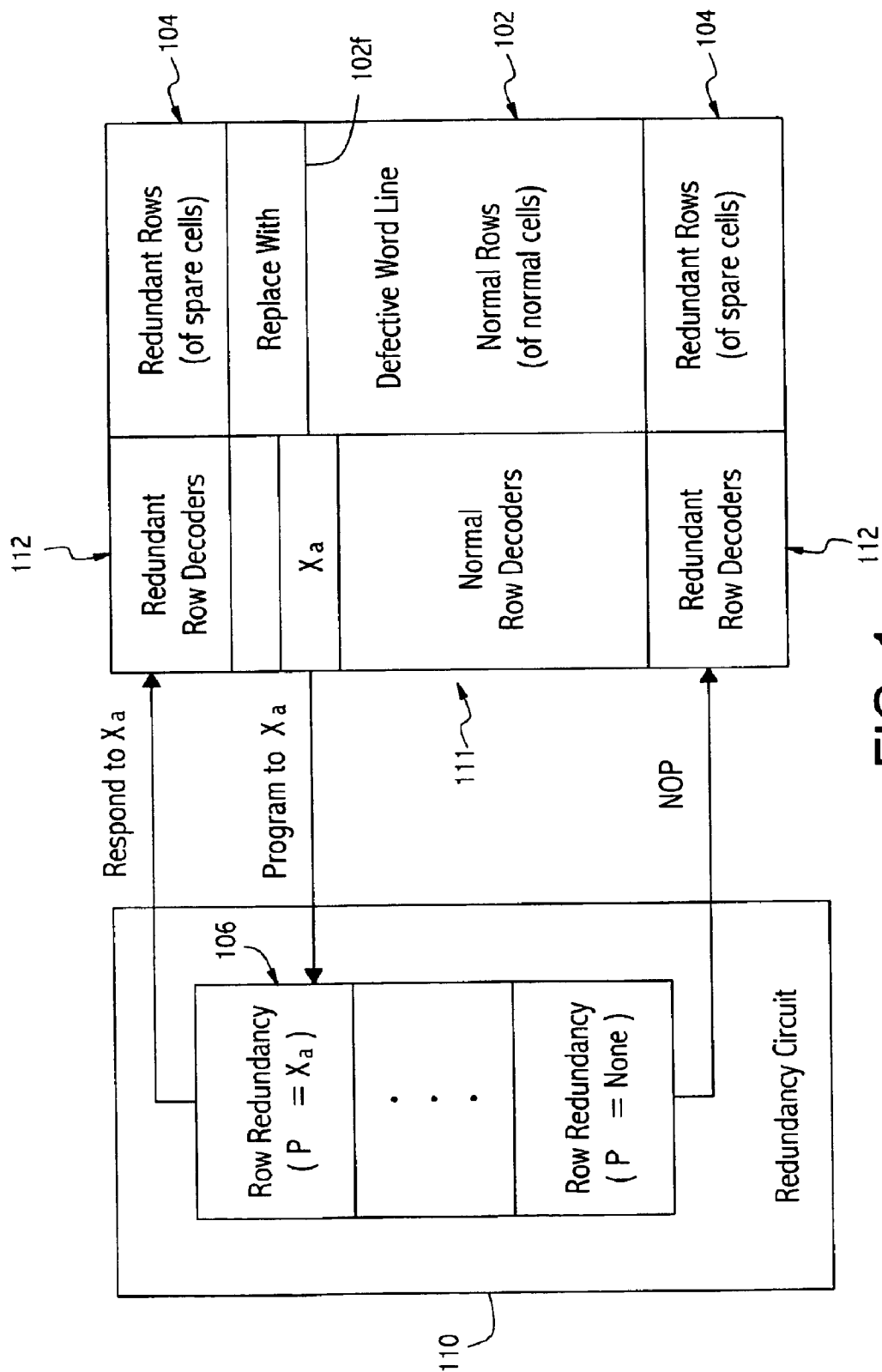
FIG. 1 illustrates an exemplary prior art scheme for replacing rows with failed memory cells with redundant rows.
Figure 2:
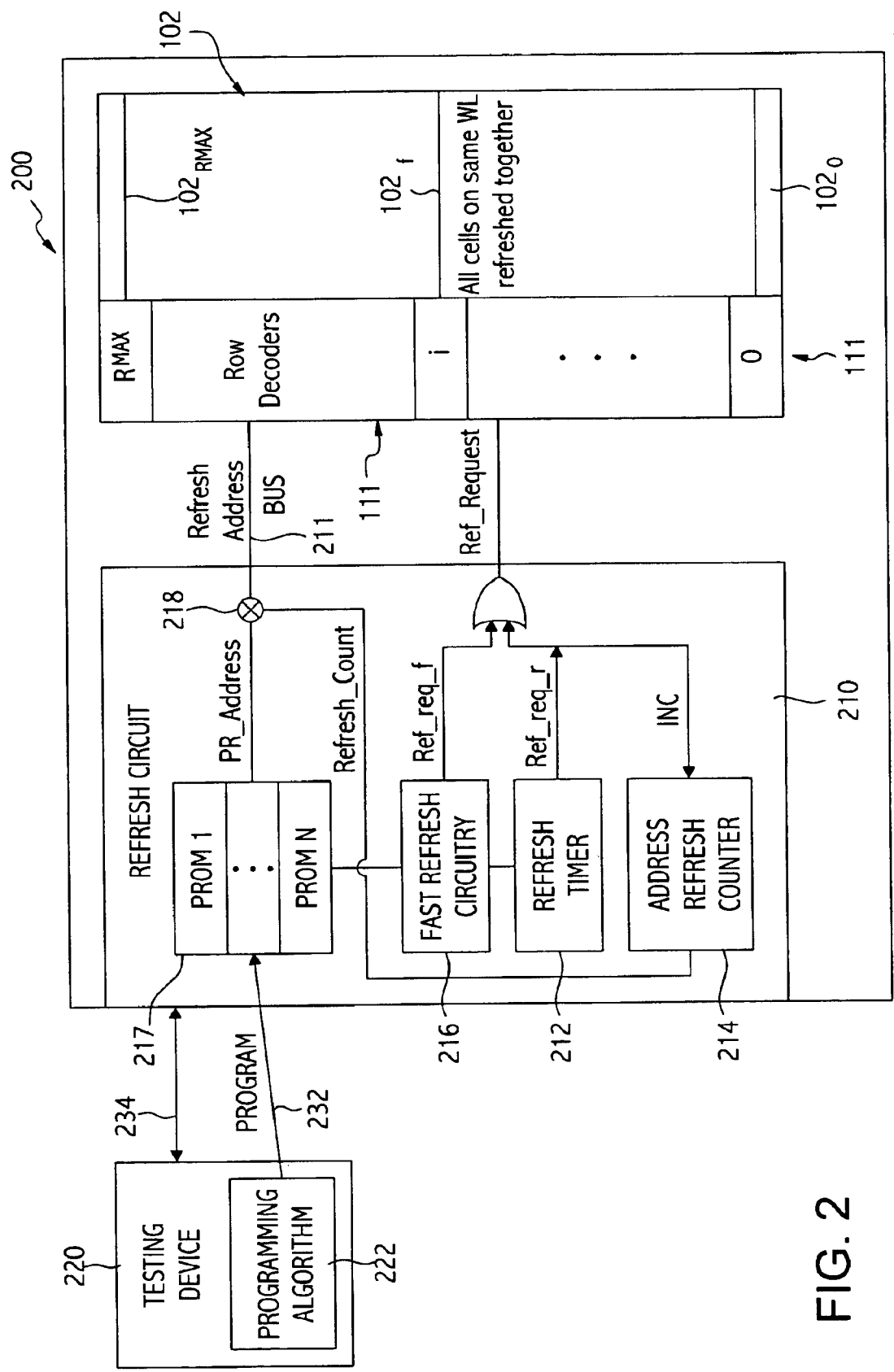
FIG. 2 illustrates an exemplary system for testing a memory device utilizing a refresh circuit in accordance with embodiments of the present invention.

FIG. 2 illustrates an exemplary system that may be utilized to test and configure a memory device 200 utilizing a refresh circuit 210 capable of refreshing rows with weak retention cells $102_F$, in accordance with embodiments of the present invention. As illustrated, the refresh circuit 210 generates a refresh address and a refresh request signal (REF_REQUEST) to row decoders 111, in order to refresh rows of memory cells 102 of the memory device 200. As illustrated, REF_REQUEST may be generated by either a regular refresh request signal (REF_REQ_R), generated by a refresh timer circuit 212, or a fast refresh request signal (REF_REQ_F).

The regular refresh request signal, REF_REQ_R, may be generated as a conventional refresh request signal, based on a periodic oscillator utilized in the refresh timer circuit 212 (as will be described below with reference to FIG. 5). The period of the oscillator may be chosen to ensure all rows 102 are refreshed within the specified retention time (e.g., tREF<tRET). During regular refresh cycles (e.g., when REF_REQUEST is generated by REF_REQ_R), a row address count generated by a refresh address counter (RAC) 214 is driven on the refresh bus 211. The RAC 214 typically increments the row address count each regular refresh cycle, and rolls over to zero at the last row $R_{MAX}$.

The fast refresh request signal, REF_REQ_F, may be generated by fast refresh circuitry 216, in order to generate refresh requests for rows with weak retention cells more frequently than the normal refresh cycle (tREF). The addresses of rows with weak retention cells may be stored in programmable read-only memory (PROM) registers 217 (which may comprise any suitable type non-volatile memory elements, such as fuses). Accordingly, during fast refresh cycles (e.g., when REF_REQUEST is generated by REF_REQ_F), the address stored in one of the PROM registers 217 is driven on the refresh bus 211. One or more pass gates 218 may control whether the row address generated by the RAC 214 or a row address stored in a PROM register 212 is driven on the refresh address bus 211.

Figure 3:
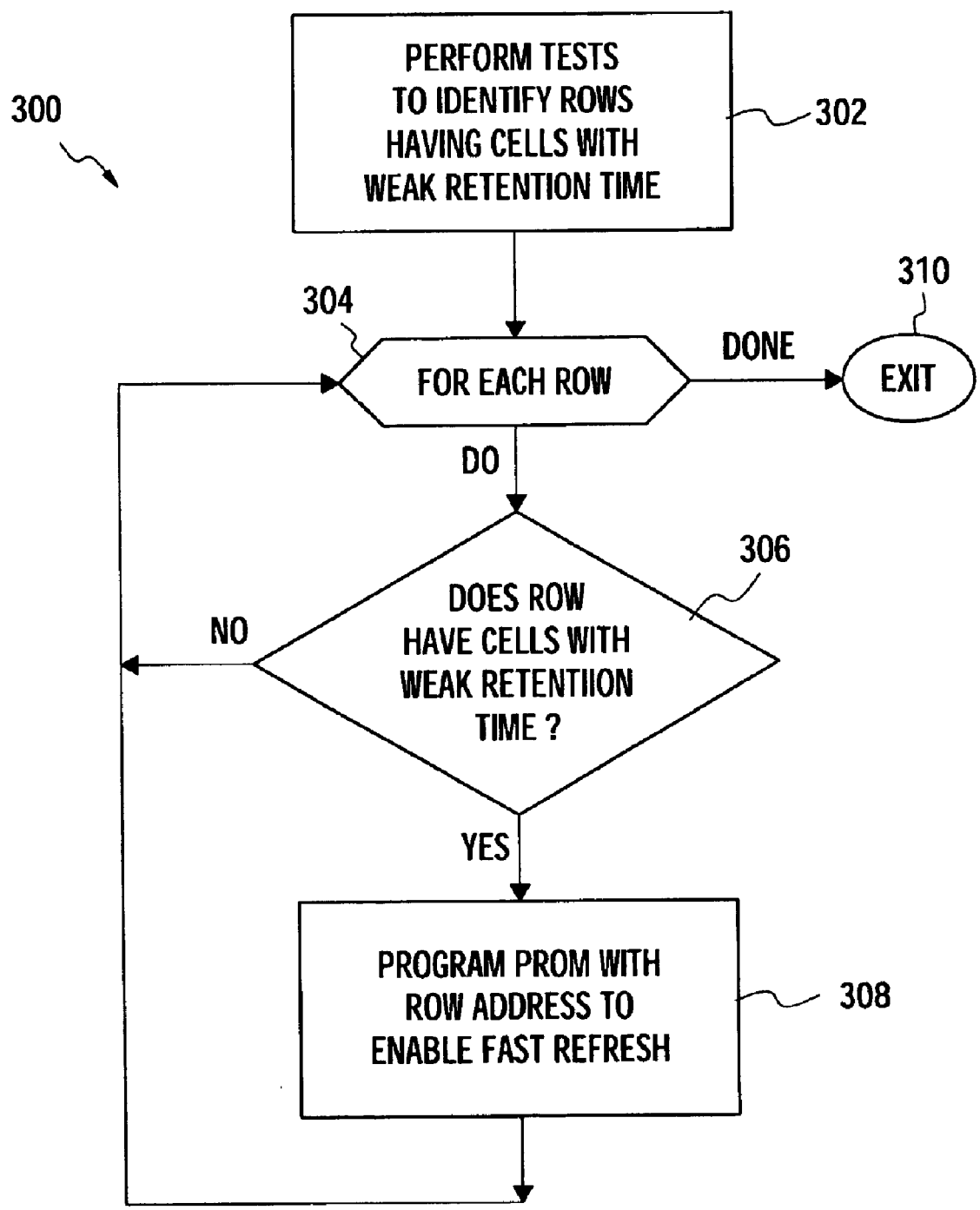
FIG. 3 illustrates exemplary operations for utilizing rows having memory cells with weak retention cells in accordance with embodiments of the present invention.

FIG. 3 illustrates a flow diagram of exemplary operations 300 that may be performed to identify rows with weak retention cells. The operations 300 may be performed during manufacturing tests, for example, by the testing device 220 illustrated in FIG. 2. The testing device 220 may be a test station, for example, comprising any suitable equipment to test one or more memory devices 220, individually or in parallel. The one or more memory devices 220 may be complete packaged integrated circuit (IC) devices or may still be on a wafer.

In any case, at step 302, tests are performed to identify rows having weak retention cells. For example, the testing device 220 may, via an interface 234, write known data to the rows and vary the period between refresh commands while reading the data back. As will be described below, memory cells may be placed in different categories based on the measured retention cells, which may be used to determine the period with which they are refreshed. At step 304, a loop of operations to be performed for each row is entered. At step 306, a determination is made as to whether a current row has one or more cells with weak retention time. If so, at step 308, a PROM register 217 is programmed with the row address, enabling fast refresh operations for that row. For example, the testing device 220 may include a programming algorithm 222 suitable for programming the PROM registers 217 via a programming interface 232 (e.g., comprising address and command lines for electrically programmable fuses or a laser cutting interface).

An Exemplary Refresh Scheme With Fast Refresh Cycles

Figure 4:
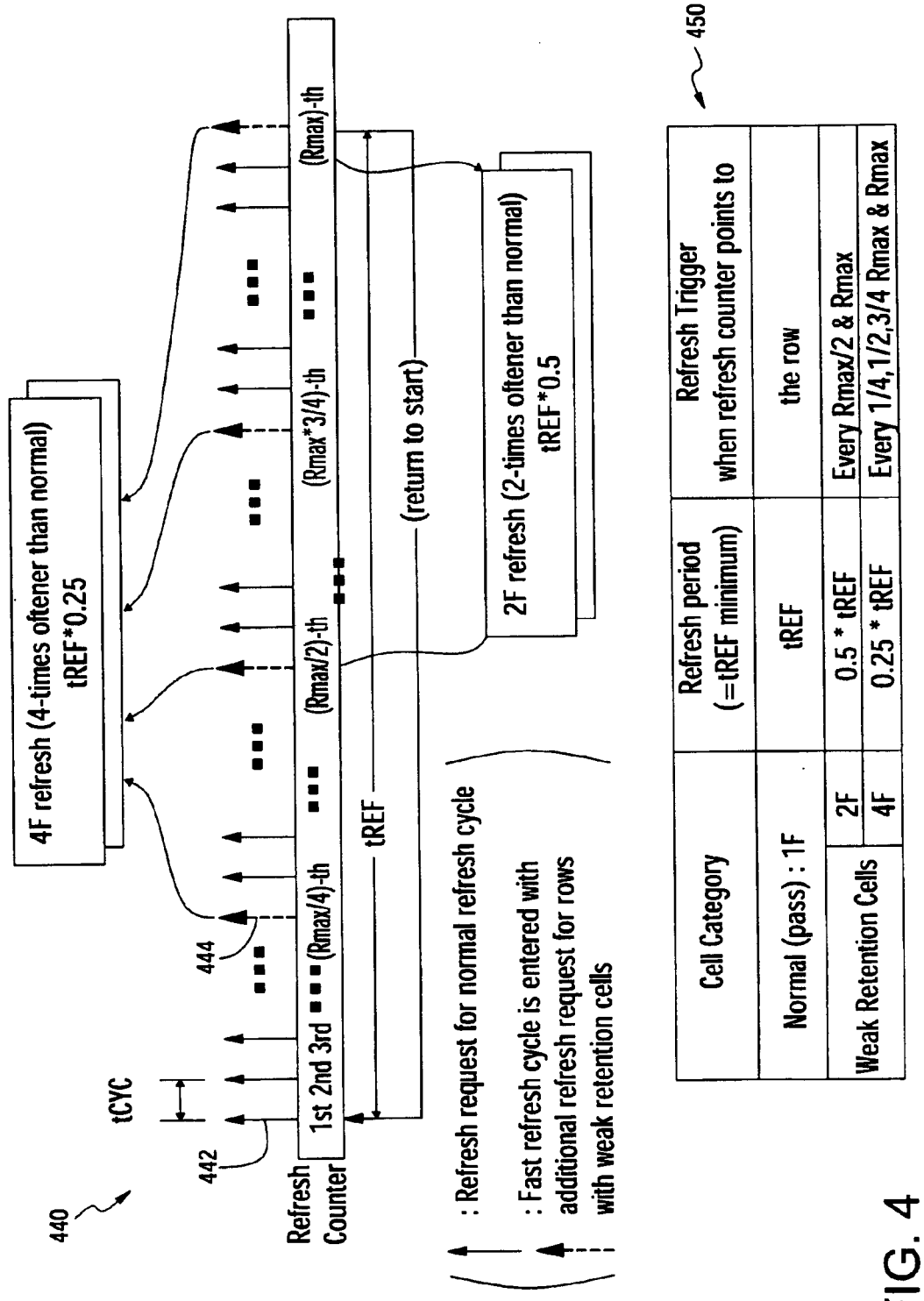
FIG. 4 illustrates an exemplary scheme for frequent refresh of rows having memory cells with weak retention cells in accordance with embodiments of the present invention.

Various refresh schemes may be utilized to increase the refresh frequency for rows with weak retention cells. For example, FIG. 4 illustrates a timing diagram 400 of refresh requests according to one exemplary refresh scheme, in which rows with weak retention cells are refreshed additionally during periodic fast refresh cycles. Solid arrows 442 represent normal refresh requests, for each row address generated by the refresh address counter 214, while dashed arrows 444 represent the beginning of fast refresh cycles. As will be described in greater detail below, during the fast refresh cycles, rows with weak retention cells (e.g., as identified by PROM registers 217) may be refreshed between normal refresh operations.

As illustrated in table 450, cells may be categorized based on their retention time and corresponding refresh period used. As illustrated, normal cells having a retention time above a specified normal minimum value are refreshed at the normal refresh period tREF. Cells having a retention time less than the normal minimum value, but above a second lower minimum retention time (e.g., half the normal), may have a refresh period of 0.5*tREF (or twice the normal refresh frequency, referred to herein as a 2F refresh scheme). For some embodiments, cells having a retention time less than the second lower minimum retention time, but above a third lower minimum retention time (e.g., one quarter the normal) may have a refresh period of 0.25*tREF (or four times the normal refresh frequency, referred to herein as a 4F refresh scheme). Therefore, it should be understood that the techniques described herein may be utilized to refresh different rows at different rates, based on the cell retention times. Of course, for some embodiments, cells having a retention time below the third minimum value (as well as memory cells that are otherwise found to be defective) may be replaced by redundancy, as described above.

Figure 5:
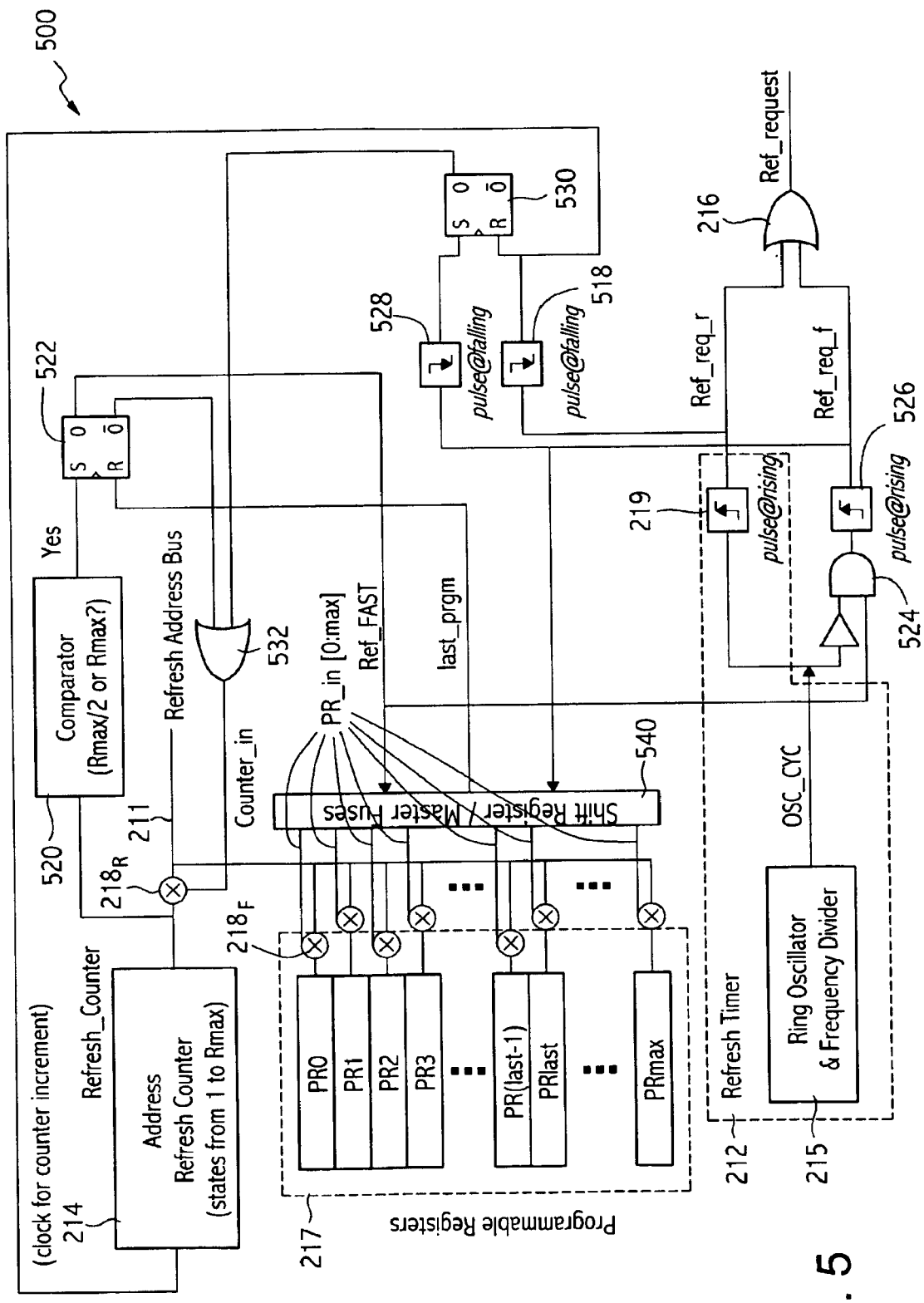
FIG. 5 illustrates an exemplary refresh circuit in accordance with embodiments of the present invention.

FIG. 5 illustrates an exemplary refresh circuit 500 that may be utilized to refresh weak retention cells during periodic fast refresh cycles. In one embodiment, the refresh circuit 500 may be utilized as the refresh circuit 210 of FIG. 2. Operation of the refresh circuit 500 may be described with reference to the corresponding timing diagram 600 of FIG. 6 that illustrates refresh request signals and the corresponding address driven on the refresh address bus 211. In the timing diagram 600, regular refresh request signals 602 (e.g., a refresh request signal caused by REF_REQ_R) are shown as solid lines, while fast refresh request signals 604 (e.g., a refresh request signal caused by REF_REQ_F) are shown as dashed lines. While FIGS. 5 and 6 illustrate two identical fast refresh cycles, beginning when the refresh address generated by the RAC 214 (hereinafter referred to as the refresh counter) is equal to $R_{MAX}/2$ and $R_{MAX}$, it should be understood that the number of refresh cycles (during a period tREF) and when they are initiated may vary.

As illustrated in FIG. 5, the periodic regular refresh request signals (REF_REQ_R) may be generated by a pulse generator 219 on a rising edge of a periodic output signal OSC_CYC of an oscillator circuit 215, at which time the refresh counter is driven on the refresh address bus 211. The falling edge of REF_REQ_R may also signal the RAC 214, via a pulse generator 518, to increment the refresh counter. A comparator circuit 520 may examine the current refresh counter to determine when to enter a fast refresh cycle. As illustrated, if the fast refresh cycle is entered in twice per refresh period (tREF), the comparator circuit 520 may generate a pulse each time the refresh counter is equal to $R_{MAX}$ or $R_{MAX}/2$, causing a latch 522 to assert a signal (REFRESH_FAST) indicating the occurrence of a fast refresh cycle.

Figure 6:
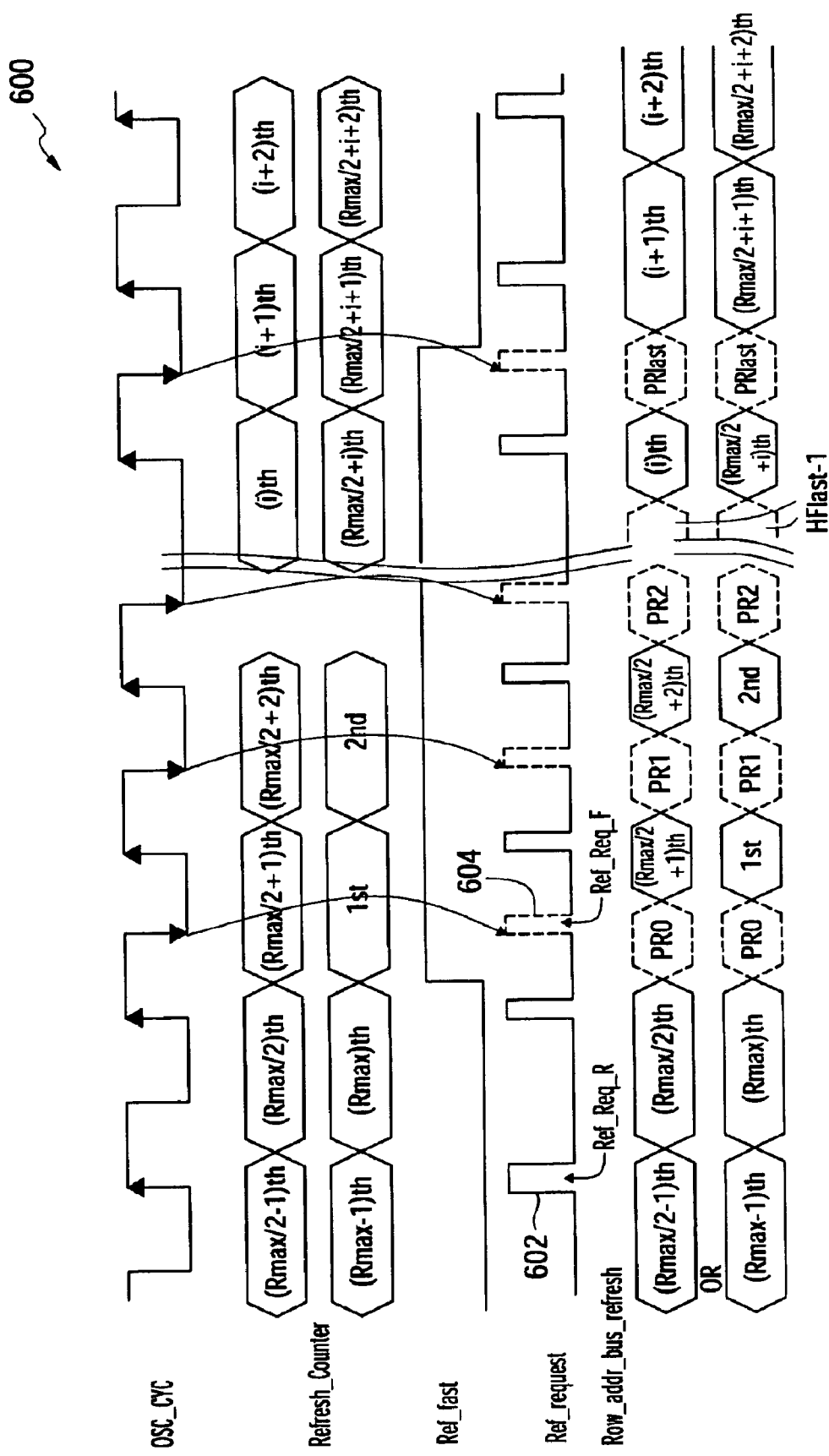
FIG. 6 illustrates an exemplary timing diagram for signals utilized in the exemplary refresh circuit of FIG. 5.

As illustrated in FIG. 6, when the REFRESH_FAST signal is asserted, fast refresh signals 604 are generated in between regular refresh signals 602, at which time an address (PR0, PR1, . . . ) stored in one of the PROM registers 217 is driven on the refresh address bus 211. As illustrated in FIG. 5, REFRESH_FAST may enable the generation of the fast refresh signals 604 on the falling edge of OSC_CYC, via an AND gate 524 and pulse generator 526. In this manner, rows with weak retention cells may be refreshed more frequently without extending the entire refresh period tREF.

To alternate between driving addresses from the PROM registers 217 and the refresh address counter 214 on the refresh address bus 211, the refresh circuit 211 may include pass gate circuitry $218_F$ and $218_R$, respectively. As illustrated, a pulse generator 528 may set a latch 530 on a falling edge of each fast refresh request signal (REF_REQ_F) which enables the pass gate circuitry $218_R$, thus driving the refresh counter on the refresh address bus 211 after each fast refresh request. Similarly, the pulse generator 518 may reset the latch 530 on a falling edge of each regular refresh request signal (REF_REQ_R) 602 which enables the pass gate circuitry $218_F$, thus driving an address stored in a PROM register 217 on the refresh address bus 211 after each regular refresh request.

The refresh circuit 500 may include a shift register 540 configured to control the pass gate circuitry $218_F$ of each PROM register 217 to supply the corresponding stored address to the refresh address bus 211. The shift register 540 may generate a signal LAST_PGRM indicating the address from the last PROM register (denoted $PR_{LAST}$) containing the address of a row with weak retention cells. As illustrated, the LAST_PGRM signal may reset the latch 522, de-asserting the REFRESH_FAST signal, signaling an end to the fast refresh cycle. This is reflected in FIG. 6, as the REFRESH_FAST signal is de-asserted, after the fast refresh request for the row $PR_{LAST}$.

Figure 7:
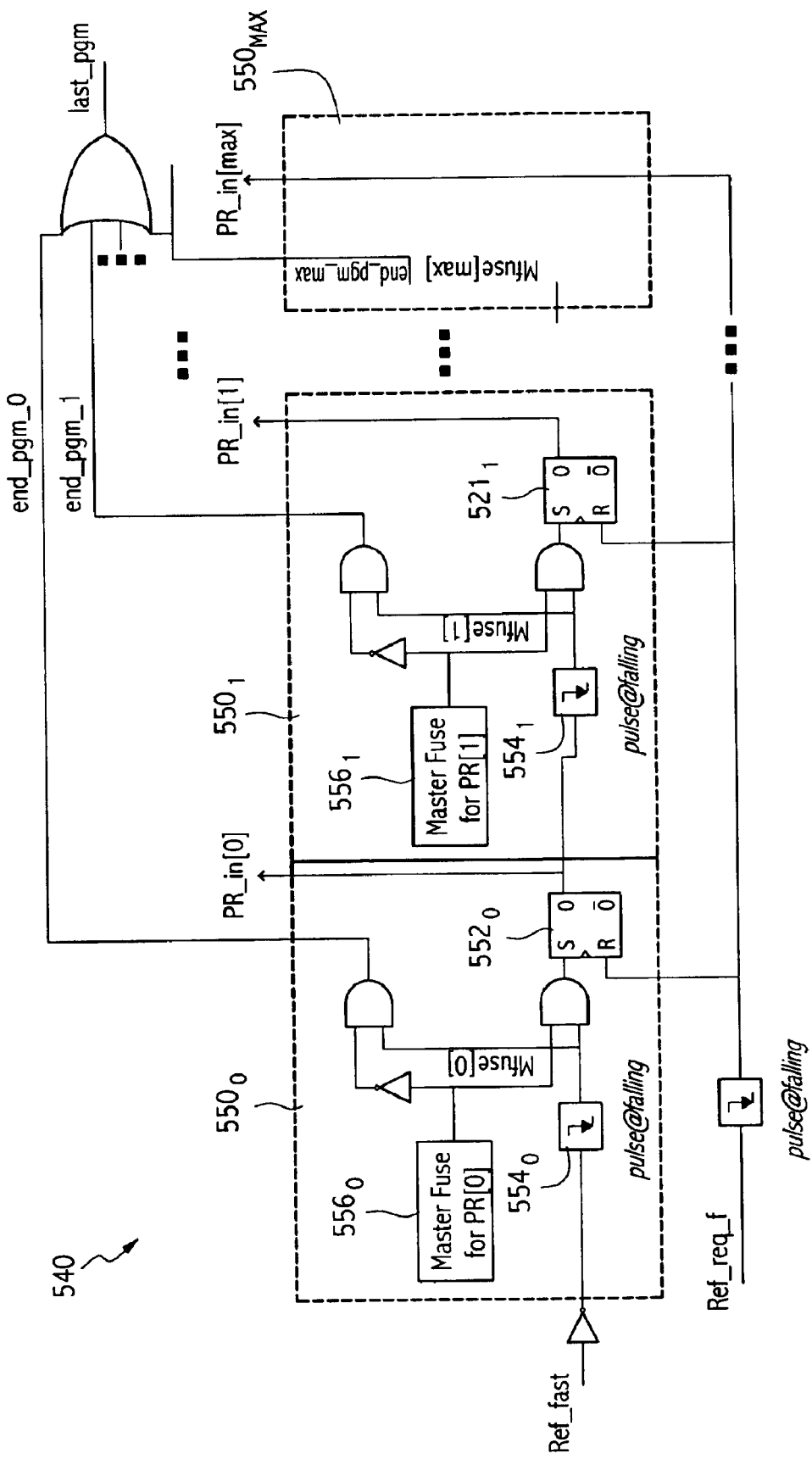
FIG. 7 illustrates an exemplary circuit configuration for the shift register utilized in the exemplary refresh circuit of FIG. 5.
Figure 8:
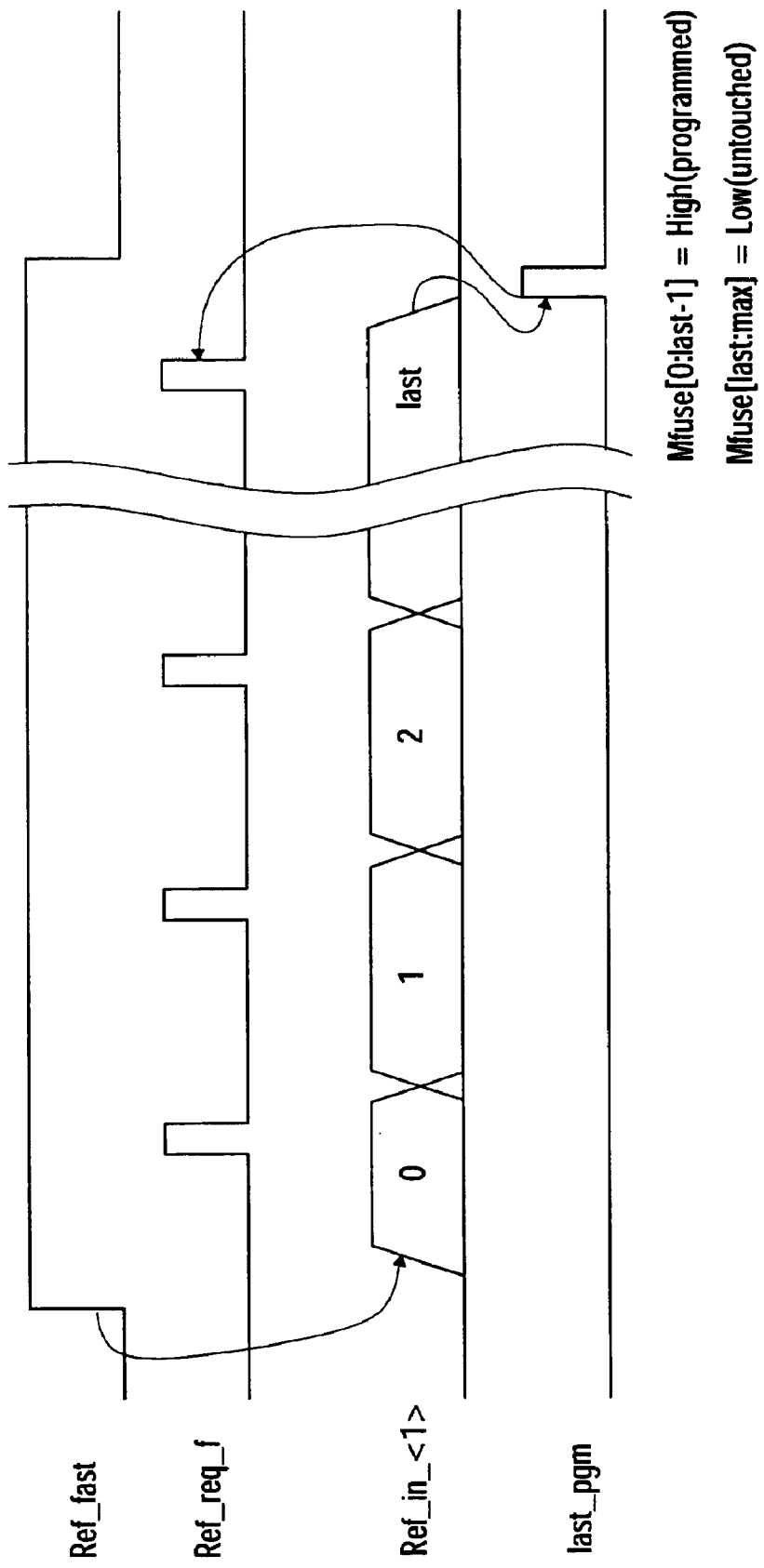
FIG. 8 illustrates an exemplary timing diagram for signals utilized in the exemplary shift register of FIG. 7.

FIG. 7 illustrates an exemplary circuit configuration of the shift register 540. As illustrated, the shift register 540 may have one stage 550 for each PROM register 217 (e.g., stages $555_0$–$550_{MAX}$). FIG. 8 illustrates a corresponding timing diagram 800 of the signals utilized in the shift register 540. During fast refresh cycles, each stage may sequentially assert a signal PR_in to enable pass gate circuitry 218F to drive the address from its corresponding PROM register 217 on the refresh address bus 211.

As illustrated, the rising edge of REFRESH_FAST may set a latch $552_0$ (via a pulse generator $554_0$) of the first stage $550_0$, initially asserting the signal PR_in[0]. The falling edge of the fast refresh request signal resets the latch $552_0$, in turn setting the latch $552_1$ of the next stage. As illustrated in FIG. 8, the PR_in signal of only one stage is asserted at any time, thus ensuring the corresponding pass gate circuitry 218F of only one PROM register will be enabled. This process is repeated until the stage 550 corresponding to the last PROM register programmed with a row address is reached, after which a LAST_PGRM pulse is generated (to reset the latch 522 of FIG. 5), signaling an end of the fast refresh cycle. LAST_PGRM may be generated by an OR gate that receives a signal END_PGM from each stage 550. As illustrated, the END_PGM signal may only be generated by a stage if the master fuse 556 for that stage is intact (indicating the corresponding PROM register has not been programmed). In other words, END_PGM will only be asserted after accessing the stage 550 for the last PROM register 217 that has been programmed.

An Exemplary Refresh Scheme Using Harmonious Addresses

For some embodiments, rather than refresh all rows with weak retention cells during a fast refresh cycle, rows with weak retention cells may be refreshed in conjunction with rows having harmonious addresses. As used herein, the term harmonious addresses refer to row addresses that occur periodically after a given address. For example, harmonious row addresses of an arbitrary row address i, may include row addresses $i+R_{MAX}/4$, $i+R_{MAX}/2$, and $i+3R_{MAX}/4$, (modulus $R_{MAX}$, of course). Therefore, if $R_{MAX}$ is an integer represented by some number of bits, harmonious addresses may differ only by one or more most significant bits.

Figure 9:
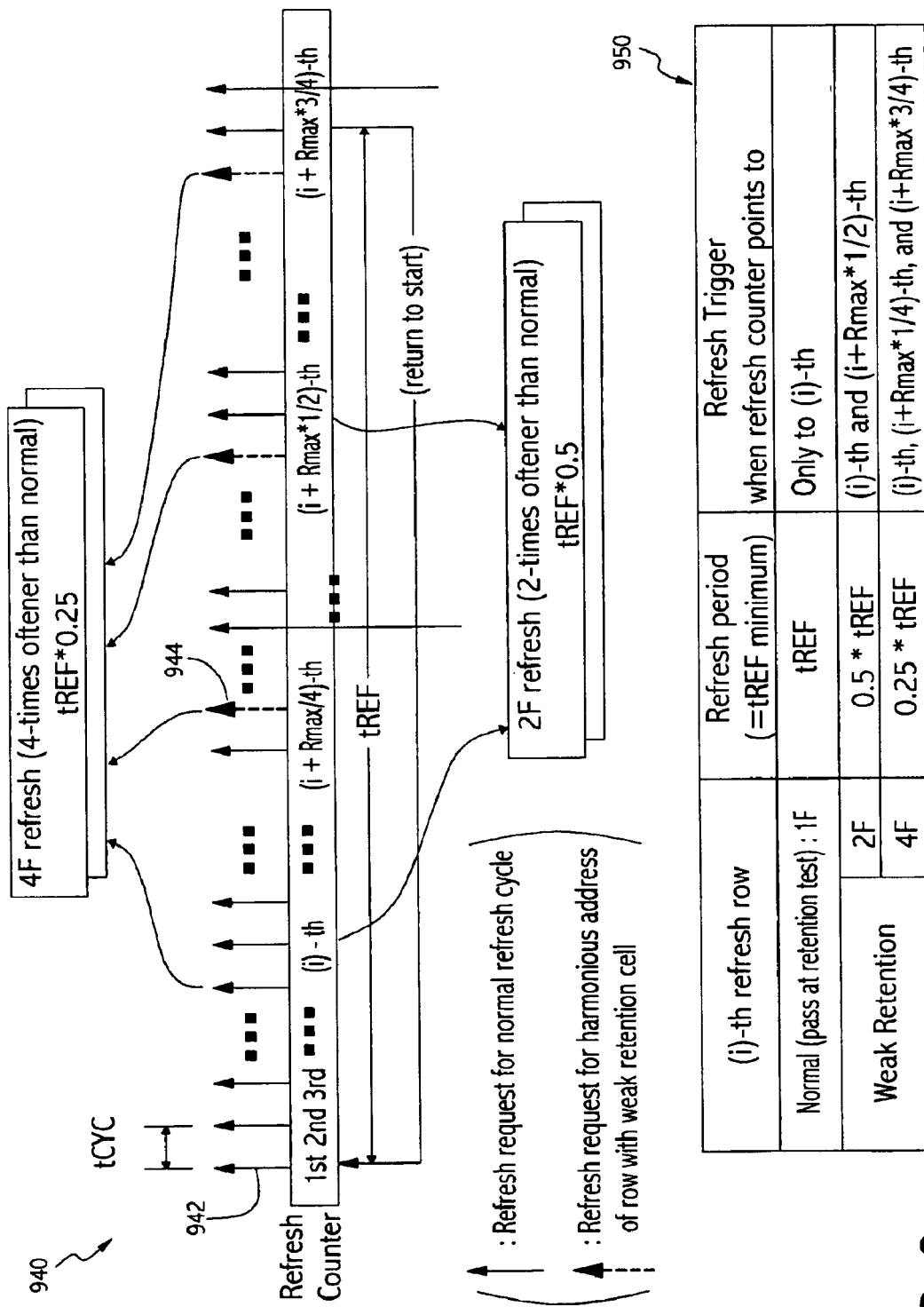
FIG. 9 illustrates another exemplary scheme for frequent refresh of rows having memory cells with weak retention cells in accordance with embodiments of the present invention.

FIG. 9 illustrates a diagram 940 of one exemplary refresh scheme, in which a row i with weak retention cells are refreshed additionally in conjunction with rows having a harmonious address. Regular refresh requests are represented by solid arrows 942 while additional refresh requests occurring in conjunction with harmonious addresses are represented by dashed arrows 944. As illustrated in the diagram 940 and in table 950, for a 2F refresh scheme, row i may be additionally refreshed in conjunction with row $i+R_{MAX}/2$, while for a 4F refresh scheme, row i may be additionally refreshed in conjunction with rows $i+R_{MAX}/4$, $i+R_{MAX}/2$, and $i+3R_{MAX}/4$.

Figure 10:
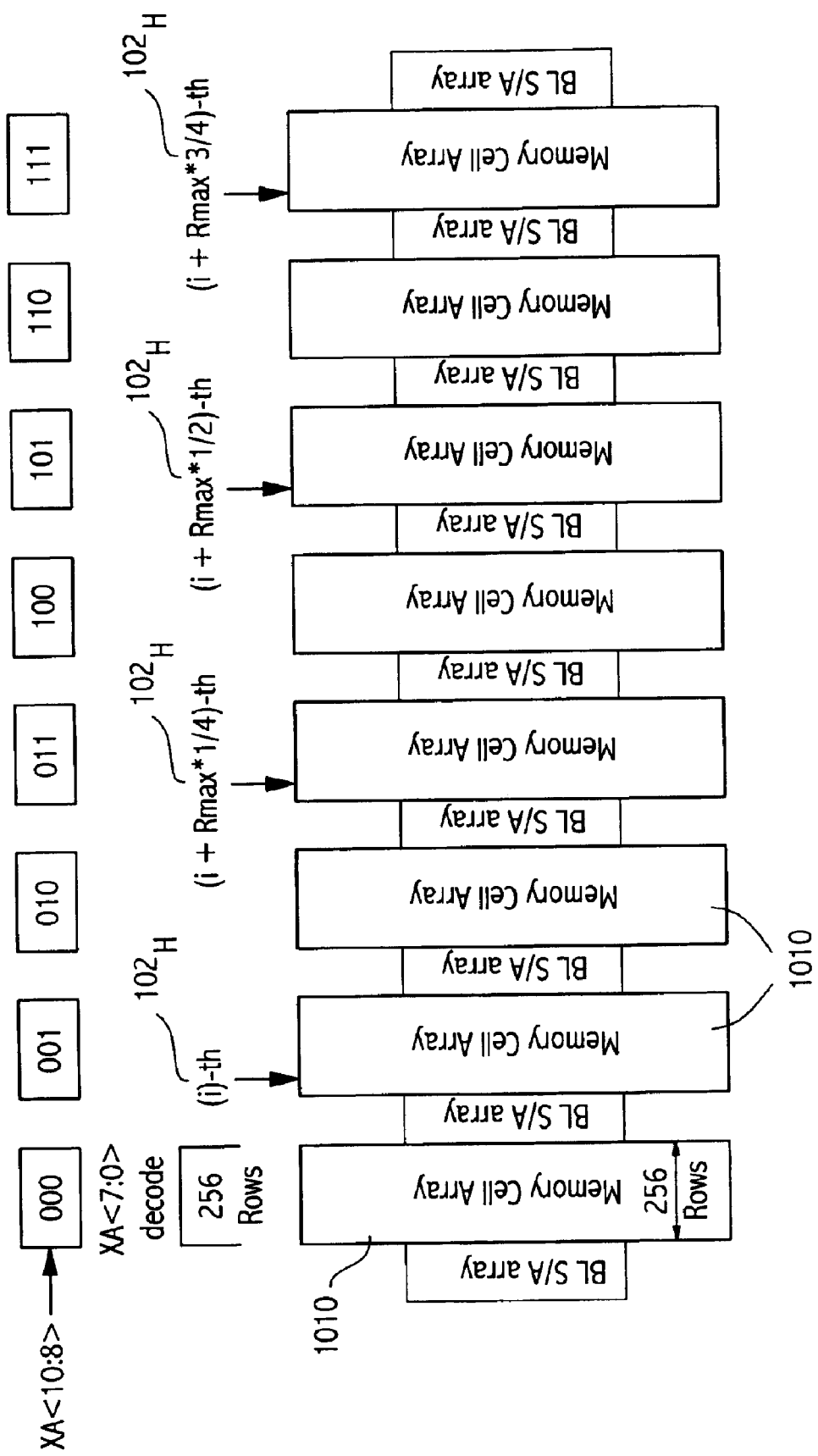
FIG. 10 illustrates an exemplary row to array mapping in accordance with embodiments of the present invention.

To perform refresh operations in multiple rows concurrently, row mappings into an array should be designed to ensure that two or more rows in the same or neighboring arrays are not harmoniously refreshed (in case of shared bit line sense amplifiers). FIG. 10 illustrates an exemplary row to array mapping which may be suitable for harmonious address refreshing. As illustrated, assuming 11-bit row addresses XA[10:0], row i ($102_i$) may have harmonious rows $102_H$ (e.g., $i+R_{MAX}/4$, $i+R_{MAX}/2$, and $i+3R_{MAX}/4$) that are located in every other array 1010 by assigning high-order address XA[10:8] to select the array.

Figure 11:
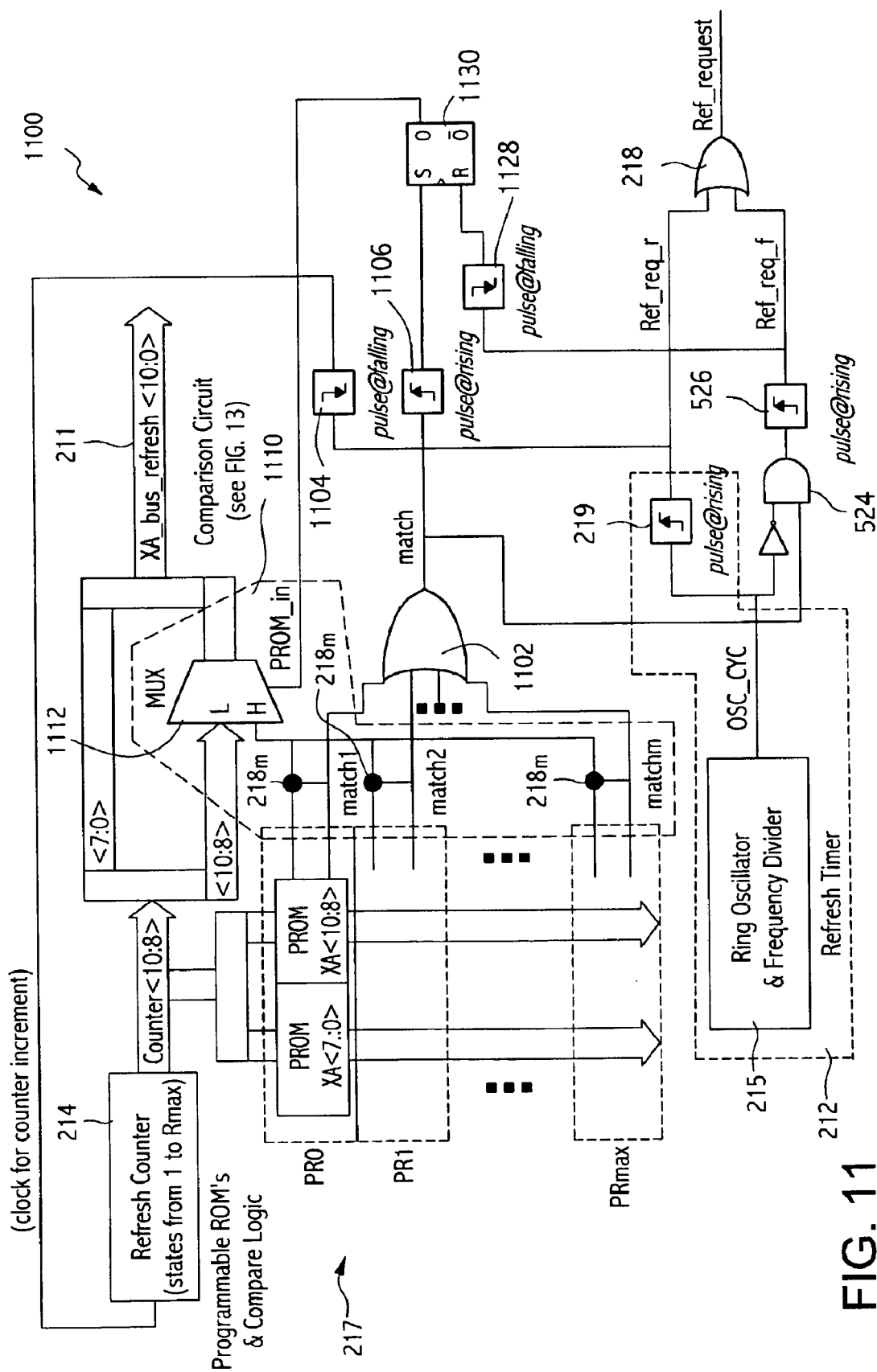
FIG. 11 illustrates another exemplary refresh circuit in accordance with embodiments of the present invention.

FIG. 11 illustrates an exemplary refresh circuit 1100 that may be utilized to refresh rows of weak retention cells in conjunction with rows having harmonic addresses. Operation of the refresh circuit 1100 may be best described with reference to the corresponding timing diagram 1200 of FIG. 12 that illustrates refresh request signals and the corresponding address driven on the refresh address bus 211 for a 2F refresh scheme.

The periodic regular refresh request signals (REF_REQ_R) may be generated by the refresh timer 212, as described above, at which time the refresh address counter is driven on the refresh address bus 211. As illustrated, the falling edge of REF_REQ_R may also cause a pulse generator 1104 to increment the current (row address) refresh counter.

The current refresh counter may be input into a comparison circuit 1110 configured to assert a match signal if the current row address matches the harmonious address of a row address stored in a PROM register 217. As illustrated, a rising edge of the match signal may cause a pulse generator 1106 to set a latch 1130, asserting a signal PROM_in to drive the row address from the PROM register 217 on the refresh address bus 211, via a multiplexer (MUX) circuit 1112. As illustrated, assertion of the match signal may also enable the generation of the fast refresh signals on the falling edge of OSC_CYC, via an AND gate 524 and pulse generator 526 (in a similar manner to the REFRESH_FAST signal of FIG. 5).

Figure 12:
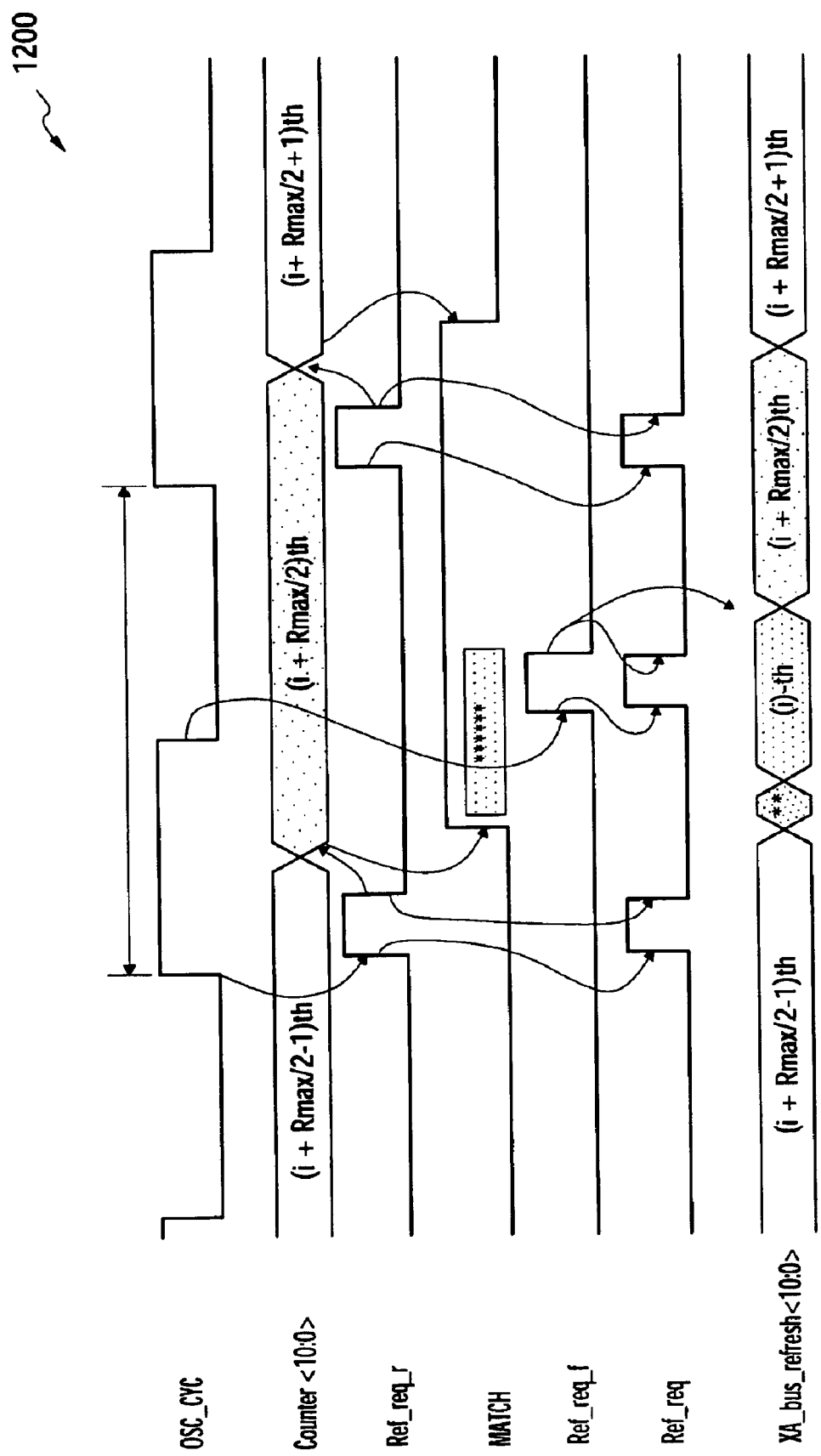
FIG. 12 illustrates an exemplary timing diagram for signals utilized in the exemplary refresh circuit of FIG. 11.

Thus, as illustrated in FIG. 12, the row (illustratively i) indicated by the address in the PROM register 217 is refreshed prior to refreshing the harmonious address (illustratively $i+R_{MAX}/2$). The falling edge of the fast refresh signal may cause a pulse generator 1128 to reset the latch 1130, signaling the MUX circuit 1112 to drive the current (harmonious) row address on the refresh address bus 211 in preparation of the following regular refresh cycle.

Figure 13A:
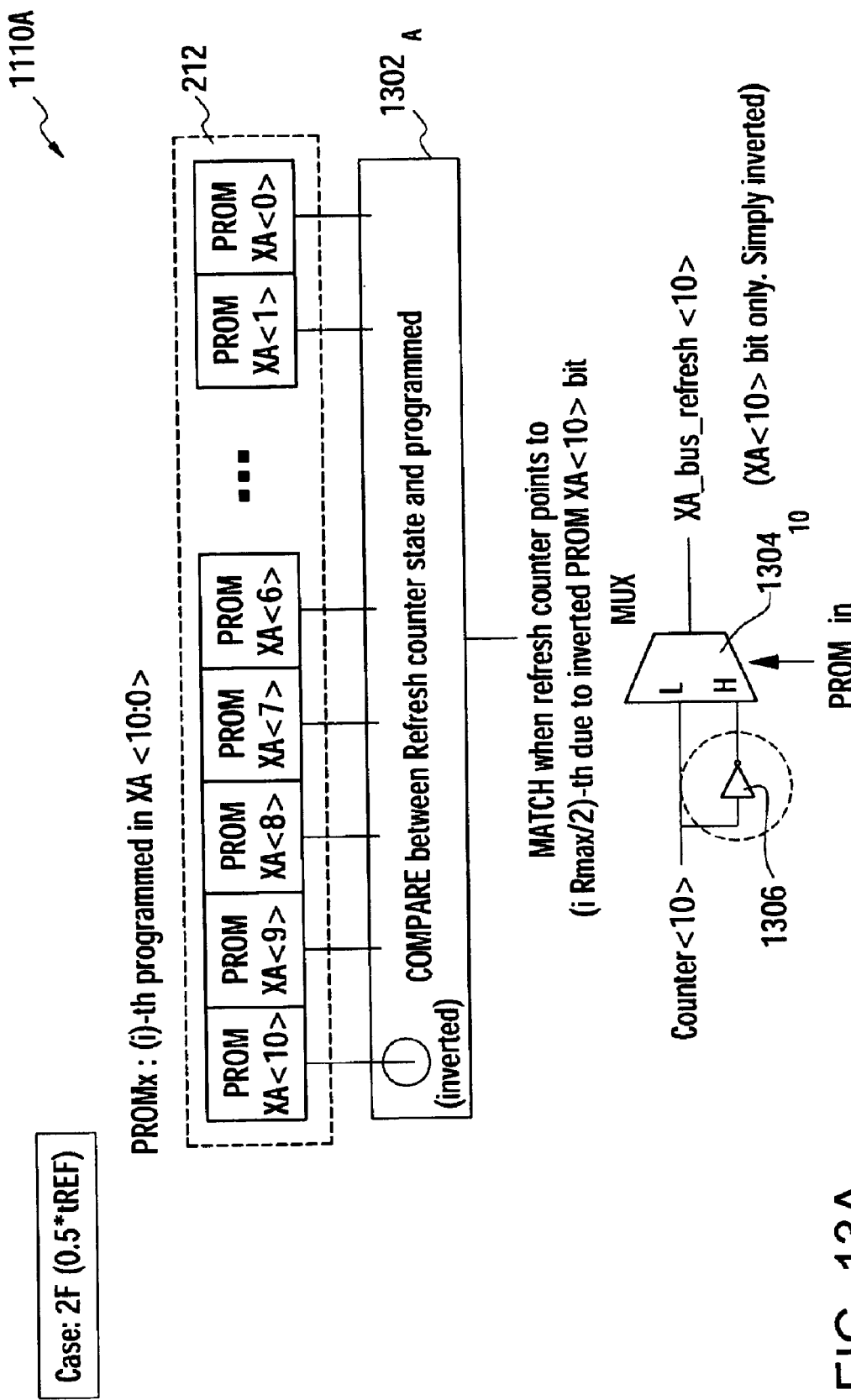
FIGS. 13A and 13B illustrate exemplary comparison circuits for use in the exemplary refresh circuit of FIG. 12.
Figure 13B:
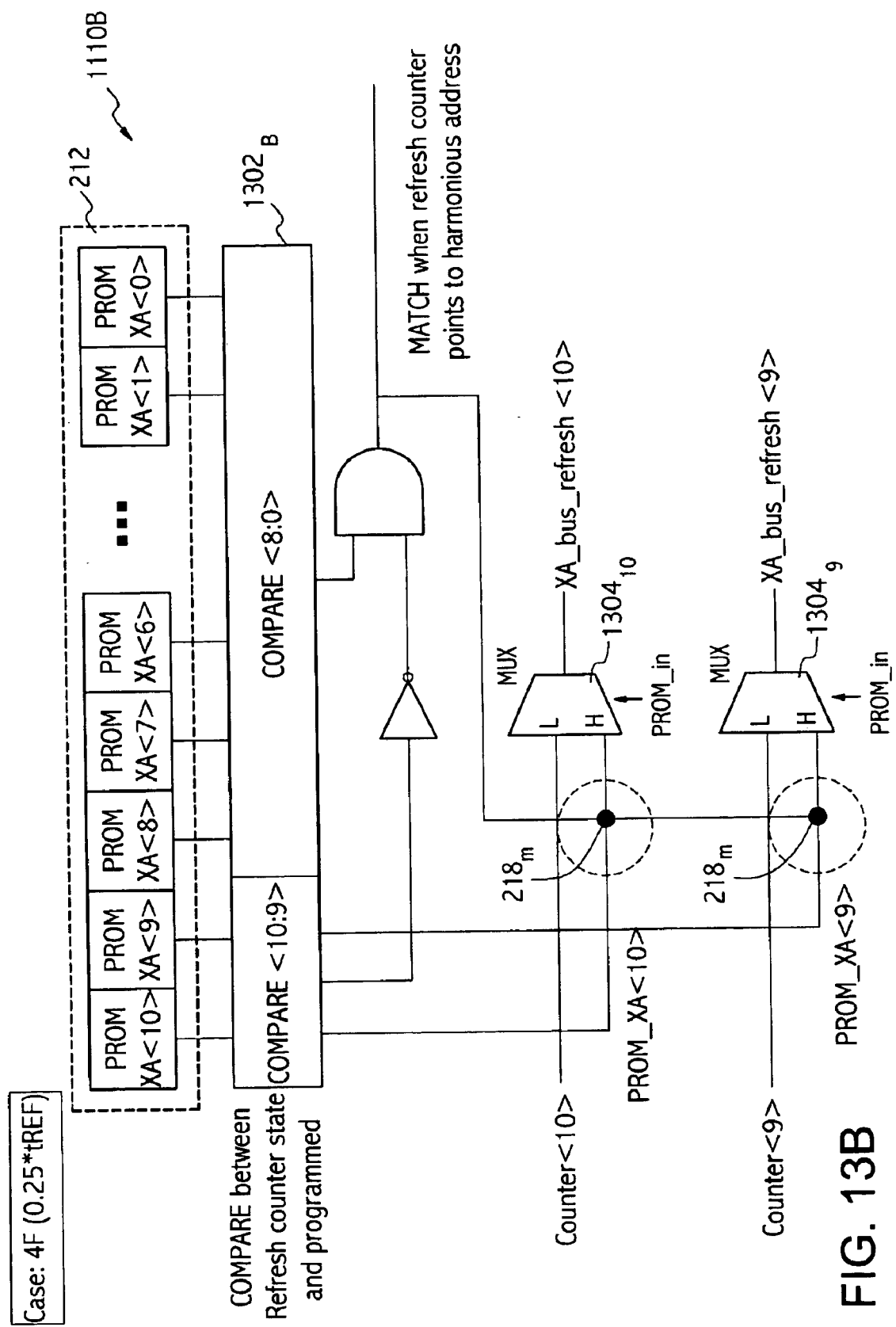

FIGS. 13A and 13B illustrate exemplary circuit configurations of comparison circuitry $1110_A$ and $1110_B$ for 2F and 4F refresh schemes, respectively. As illustrated in FIG. 13A, for the 2F refresh scheme, the row address i and harmonious address i+RMAX/2 may only differ by the most significant bit. Thus, the comparison circuitry $1110_A$ may include circuitry $1302_A$ to compare the refresh counter to an address in a PROM register 217 after inverting the most significant bit (bit 10 in the illustrated example), to generate the match signal. The row address from the PROM register 217 may be driven on the refresh address bus 211 by simply inverting (via an inverter 1306) the most significant bit of the refresh counter, via a MUX $1304_{10}$ when a PROM_in signal is asserted.

As illustrated in FIG. 13B, for the 4F refresh scheme, the row address i and harmonious addresses ($i+R_{MAX}/4$, $i+R_{MAX}/2$, $i+3R_{MAX}/4$) may only differ by the two most significant bits. Thus, the comparison circuitry $1110_B$ may include circuitry $1302_B$ to compare the lower bits (illustratively bits 8:0) in the refresh counter to an address in a PROM register 217. If the lower bits match, the comparison circuitry $1110_B$ asserts the MATCH signal, so long as the upper bits (illustratively, bits 10:9) do not also match. In other words, a match on the upper bits would indicate a regular refresh cycle for row i (not a row with a harmonious address). If the match signal is asserted, pass gates $218_M$ are turned on. Thus, the row address from the PROM register 217 may be driven on the refresh address bus 211 via MUX circuits $1304_{10}$ and when the PROM_in signal is asserted.

Of course the circuits of FIGS. 13A–13B may be modified (or may utilize various circuitry not shown) to accommodate various situations that may arise. For example, in a 4F refresh scheme, it may be possible that two or more rows having harmonious addresses contain weak retention cells (e.g., rows i AND row $i+R_{MAX}/4$). In such a case, more complicated circuitry may be required in order to refresh each during regular refresh cycles for each harmonious address (e.g., both may be refreshed during a regular refresh cycle for row $i+R_{MAX}/2$. As an alternative, one of the rows may be replaced by redundancy, relieving the contention.

CONCLUSION

Rows having cells with weak retention times may be refreshed more frequently than rows having only cells with stronger retention times. Thus, such frequent refreshing may reduce the number of redundant circuits required, thus conserving chip real estate, and potentially reducing overall device cost.

While the foregoing is directed to embodiments of the present invention, other and further embodiments of the invention may be devised without departing from the basic scope thereof, and the scope thereof is determined by the claims that follow.

What is claimed is:

1. A method for utilizing memory cells in a semiconductor memory device having a weak retention time, comprising:
   refreshing a first set of one or more rows of memory cells at a first frequency by generating a set of regular refresh request signals, wherein at least one of the rows of the first or second sets of rows is refreshed with each regular refresh request signal; and
   refreshing a second set of one or more rows of memory cells at a second frequency greater than the first frequency by generating a set of supplemental refresh request signals, wherein at least one of the rows of the second set of rows are refreshed with each supplemental refresh request signal;
   wherein a supplemental refresh request signal, of the set of supplemental refresh request signals, is generated to refresh a given row of the second set of rows in conjunction with a regular refresh signal, of the set of regular refresh request signals, generated to refresh a row having a harmonious address, harmonious addresses being row addresses occurring periodically after the address of the given row and having a defined periodic spacing therebetween.

2. The method of claim 1, further comprising identifying the first one or more rows as having one or more cells with retention times below a first minimum value.

3. The method of claim 1, wherein the second frequency is at least twice the first frequency.

4. The method of claim 1, wherein the second frequency is at least four times the first frequency.

5. The method of claim 1, further comprising refreshing a third set of rows of one or more memory cells at a third frequency.

6. A method of manufacturing a semiconductor memory device, comprising:
   testing rows of memory cells of the device to identify a first set of one or more rows having one or more memory cells with a retention time below a first minimum retention time;
   storing an indication of the first set of rows on the device; and
   providing refresh circuitry on the device configured to refresh the first set of rows more frequently than other rows having only memory cells with retention times at or above the first minimum retention time, wherein the refresh circuitry is configured to generate a set of regular refresh request signals and a set of supplemental refresh signals, wherein each of the other rows is refreshed with a regular refresh request signal and each of the first set of rows is refreshed both with a regular refresh request signal and a supplemental refresh signal;
   wherein a supplemental refresh request signal is generated to refresh a given row of the first set of rows in conjunction with a regular refresh signal generated to refresh a row having a harmonious address, harmonious addresses being row addresses occurring periodically after the address of the given row and having a defined periodic spacing therebetween.

7. The method of claim 6, wherein storing an indication of the first set of rows on the device comprises programming one or more non-volatile memory elements with row addresses of the first set of rows.

8. The method of claim 7, wherein programming one or more non-volatile memory elements comprises altering one or more fuses.

9. The method of claim 6, further comprising testing rows of memory cells of the device to identify a second set of one or more rows having one or more memory cells with a retention time below a second minimum retention time lower than the first minimum retention time.

10. The method of claim 9, wherein the refresh circuitry is configured to refresh the second set of rows more frequently than the first set of rows.

11. The method of claim 9, further comprising providing redundancy circuitry to replace the second set of rows with one or more redundant rows.

12. A semiconductor memory device, comprising:
   a plurality of rows of memory cells, each having a corresponding row address;
   a plurality of non-volatile memory elements to store row addresses of a first set of one or more of the rows having one or more memory cells with retention times below a first minimum retention time; and
   refresh circuitry configured to perform refresh operations for the first set of rows, whose row addresses are stored in the non-volatile memory elements, more frequently than for other rows having only memory cells with retention times at or above the first minimum retention time by generating periodic regular refresh signals to refresh each of the plurality of memory cells within a refresh period and generating fast refresh request signals to additionally refresh each of the first set of rows whose addresses are stored in the non-volatile memory elements;
   wherein a fast refresh request signal is generated to refresh a given row of the first set of rows in conjunction with a regular refresh signal generated to refresh a row having a harmonious address, harmonious addresses being row addresses occurring periodically after the address of the given row and having a defined periodic spacing therebetween.

13. The device of claim 12, wherein:
   the plurality of non-volatile memory elements are also to indicate a second set of one or more of the rows having one or more memory cells with retention times below a second minimum retention time less than the first minimum retention time; and
   the refresh circuitry is further configured to perform refresh operations for the second set of rows more frequently than for the first set of rows.

14. The device of claim 12, wherein the refresh circuitry is configured to generate the fast refresh request signals during a fast refresh cycle occurring periodically within the refresh period.

15. The device of claim 14, wherein:
   the plurality of rows comprises N rows; and
   the fast refresh cycle occurs after every N/2 periodic regular refresh signals.

16. The device of claim 14, wherein:
   the plurality of rows comprises N rows; and
   the fast refresh cycle occurs after every N/4 periodic regular refresh signals.

17. The device of claim 12, wherein during fast refresh cycles, addresses stored in the non-volatile memory elements are supplied to a refresh address bus coincident with the fast refresh request signals.

18. The device of claim 17, further comprising a shift register to sequentially control supplying addresses stored in the non-volatile memory elements to the refresh address bus, wherein the shift register is clocked by the fast refresh request signals.

19. The device of claim 18, wherein the shift register generates a signal to terminate the fast refresh cycle upon detecting a non-volatile memory element that is not programmed with a row address.

20. The device of claim 12, further comprising a plurality of redundant rows of memory cells and circuitry to replace one or more of the rows having a retention time below a second minimum retention time, less than the first minimum retention time, with one or more redundant rows.

21. A semiconductor memory device, comprising:

N rows of memory cells, wherein N is an integer;

a plurality of non-volatile memory elements to indicate a first set of one or more of the N rows having one or more memory cells with retention times below a first minimum retention time;

a refresh address bus;

a refresh address counter to generate a row address; and refresh circuitry configured to i) generate regular refresh signals to sequentially refresh the N rows while driving the row address generated by the refresh address counter on the refresh address bus and ii) generate fast refresh signals to additionally refresh the first set of rows while driving row addresses of the first set of rows on the refresh address bus;

wherein a fast refresh signal is generated to refresh a given row of the first set of rows in conjunction with a regular refresh signal generated to refresh a row having a harmonious address, harmonious addresses being row addresses occurring periodically after the address of the given row and having a defined periodic spacing therebetween.

22. The device of claim 21, wherein the refresh circuitry is configured to generate fast refresh signals to refresh a row having a row address i in conjunction with regular refresh signals generated to refresh a row having a row address (i+N/M) modulus N, wherein N/M is an integer.

23. The device of claim 21, wherein the refresh circuitry is configured to generate fast refresh signals to refresh a row having a row address i in conjunction with regular refresh signals generated to refresh a row having a row address (i+N/2) modulus N.

24. The device of claim 23, wherein the refresh circuitry is configured to generate the fast refresh signals to refresh the row having a row address i between successive regular refresh signals including the regular refresh signal for the row having the row address (i+N/2) modulus N.

25. The device of claim 21, wherein the refresh circuitry is configured to generate fast refresh signals to refresh a row having a row address i in conjunction with regular refresh signals generated to refresh rows having row addresses (i+N/4) modulus N, (i+N/2) modulus N, and (i+3*N/4) modulus N.

26. The device of claim 21, wherein the refresh circuitry is configured to drive row addresses of the first set of rows on the refresh address bus by inverting one or more most significant bits of the row address generated by the refresh address counter.

* * * * *